(12) United States Patent
Harold

(10) Patent No.: US 8,841,196 B1
(45) Date of Patent: Sep. 23, 2014

(54) SELECTIVE DEPOSITION OF SILVER FOR NON-VOLATILE MEMORY DEVICE FABRICATION

(75) Inventor: Scott Brad Harold, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 68 days.

(21) Appl. No.: 13/249,115

(22) Filed: Sep. 29, 2011

Related U.S. Application Data

(60) Provisional application No. 61/387,963, filed on Sep. 29, 2010.

(51) Int. Cl.
*H01L 21/20* (2006.01)

(52) U.S. Cl.
USPC .................................. 438/382; 257/E21.003

(58) Field of Classification Search
USPC .................. 438/482, 381, 382; 257/E21.003, 257/E21.004, E21.35, E21.351, 2–4; 365/148
See application file for complete search history.

(56) References Cited

U.S. PATENT DOCUMENTS

| | | | |
|---|---|---|---|
| 5,707,487 A | 1/1998 | Hori et al. | |
| 6,939,787 B2 | 9/2005 | Ohtake et al. | |
| 7,023,093 B2 | 4/2006 | Canaperi et al. | |
| 7,238,607 B2 | 7/2007 | Dunton et al. | |
| 7,474,000 B2 | 1/2009 | Scheuerlein et al. | |
| 7,550,380 B2 | 6/2009 | Elkins et al. | |
| 7,786,589 B2 | 8/2010 | Matsunaga et al. | |
| 7,824,956 B2 | 11/2010 | Schricker et al. | |
| 7,829,875 B2 | 11/2010 | Scheuerlein | |
| 7,858,468 B2 | 12/2010 | Liu et al. | |
| 7,968,419 B2 | 6/2011 | Li et al. | |
| 8,088,688 B1 | 1/2012 | Herner | |
| 8,097,874 B2 | 1/2012 | Venkatasamy et al. | |
| 8,389,971 B2 | 3/2013 | Chen et al. | |
| 8,399,307 B2 | 3/2013 | Herner | |
| 2003/0052330 A1 | 3/2003 | Klein | |
| 2004/0192006 A1 | 9/2004 | Campbell et al. | |
| 2004/0194340 A1 | 10/2004 | Kobayashi | |
| 2007/0087508 A1 | 4/2007 | Herner | |
| 2007/0105390 A1 | 5/2007 | Oh | |
| 2008/0185567 A1 | 8/2008 | Kumar et al. | |
| 2009/0134432 A1 | 5/2009 | Tabata et al. | |
| 2009/0256130 A1 | 10/2009 | Schricker | |
| 2010/0012914 A1 | 1/2010 | Xu et al. | |
| 2010/0019310 A1 | 1/2010 | Sakamoto | |

(Continued)

FOREIGN PATENT DOCUMENTS

KR 1020110014248 A 2/2011

OTHER PUBLICATIONS

Office Action for U.S. Appl. No. 13/564,639, dated Dec. 6, 2013.

(Continued)

*Primary Examiner* — Daniel Luke
*Assistant Examiner* — Latanya N Crawford
(74) *Attorney, Agent, or Firm* — Ogawa P.C.

(57) ABSTRACT

A method of forming a non-volatile memory device includes providing a semiconductor substrate having a surface region, thereafter forming a first dielectric layer overlying, thereafter forming a first wiring material, thereafter forming amorphous silicon layer, and patterning and etching these layers to form first structures extending in a first direction and having a switching element. Thereafter, a method may include depositing a second dielectric layer overlying the first structures and having a dielectric surface region, forming an opening region in the second dielectric material to exposing part of the switching element, and depositing a silver material in the opening region, but not on the dielectric surface region.

19 Claims, 5 Drawing Sheets

(56) References Cited

U.S. PATENT DOCUMENTS

| | | |
|---|---|---|
| 2010/0032640 A1 | 2/2010 | Xu |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157710 A1 | 6/2010 | Lambertson et al. |
| 2011/0068373 A1 | 3/2011 | Minemura et al. |
| 2011/0133149 A1 | 6/2011 | Sonehara |
| 2011/0284814 A1 | 11/2011 | Zhang |
| 2011/0312151 A1 | 12/2011 | Herner |
| 2012/0001145 A1 | 1/2012 | Magistretti et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043621 A1 | 2/2012 | Herner |
| 2012/0043654 A1 | 2/2012 | Lu et al. |
| 2012/0074374 A1 | 3/2012 | Jo |
| 2012/0074507 A1 | 3/2012 | Jo et al. |
| 2012/0142163 A1 | 6/2012 | Herner |
| 2012/0220100 A1 | 8/2012 | Herner |
| 2012/0250183 A1 | 10/2012 | Tamaoka et al. |
| 2012/0252183 A1 | 10/2012 | Herner |
| 2013/0264535 A1 | 10/2013 | Sonehara |

OTHER PUBLICATIONS

Notice of Allowance for U.S. Appl. No. 13/461,725, dated Nov. 13, 2013.
International Search Report and Written Opinion for PCT/US2013/061244, filed on Sep. 23, 2013.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 datd Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Office Action for U.S. Appl. No. 12/913,719 dated Feb. 17, 2011.
Office Action for U.S. Appl. No. 12/913,719 dated Jul. 22, 2011.
Notice of Allowance for U.S. Appl. No. 12/913,719 dated Mar. 12, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament MEmory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
Interntaional Search Report for PCT/US2011/045124 filed on Jul. 22, 2011.
Written Opinion of the International Searching Authority for PCT/US2011/045124 filed on Jul. 22, 2011.
Peng-Heng Chang et al, "Aluminum spiking at contact windows in Al/Ti-W/Si", Appl. Phys. Lett., Jan. 25, 1988, pp. 272-274, vol. 52 No. 4, American Institute of Physics.
J. Del Alamo et al, "Operating limits of Al-alloyed high-low junction for BSF solar cells", Solid-State Electronics, 1981, pp. 415-420, vol. 24, Pergamon Press Ltd., Great Britain.
Hao-Chih Yuan et al, "Silicon Solar Cells with Front Hetero-Contact and Aluminum Alloy Back Junction", NREL Conference Paper CP-520/42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Notice of Allowance for U.S. Appl. No. 13/532,019 dated Nov. 14, 2012.
Office Action for U.S. Appl. No. 13/564,639, dated Mar. 19, 2013.
John S. Suehle et al., "Temperature Dependence of Soft Breakdown and Wear-Out in Sub-3 nm $SiO_2$ Films", IEEE 38" Annual International Reliability Physics Symposium, 2000, pp. 33-34, San Jose, California.
Woonki Shin et al. "Effect of Native Oxide on Polycrystalline Silicon CMP", Journal of the Korean Physical Society, Mar. 2009, pp. 1077-1081, vol. 54, No. 3.
Office Action for U.S. Appl. No. 13/447,036 dated Jul. 9, 2013.
Office Action for U.S. Appl. No. 13/764,698 dated Jul. 11, 2013.
Office Action for U.S. Appl. No. 13/481,600 dated Sep. 20, 2013.
Office Action for U.S. Appl. No. 13/764,698, dated May 21, 2014.

SELECTIVE DEPOSITION OF SILVER FOR NON-VOLATILE MEMORY DEVICE FABRICATION

CROSS-REFERENCE TO RELATED APPLICATIONS

The present invention is a non-provisional application of U.S. App. No. 61/387,963, filed Sep. 29, 2010. The provisional application is incorporated herein by reference, for all purposes.

BACKGROUND

The present invention is generally related to resistive switching devices. More particularly, embodiments according to the present invention provide a method and a structure for forming a resistive switching device. The present invention can be applied to non-volatile memory devices but it should be recognized that the present invention can have a much broader range of applicability.

The success of semiconductor devices has been mainly driven by an intensive transistor down-scaling process. However, as field effect transistors (FET) approach sizes less than 100 nm, problems such as the short channel effect degrade device performance. Moreover, such sub 100 nm device sizes can lead to sub-threshold slope non-scaling and increase in power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Switching a PCRAM device requires large amounts of power. Organic RAM or ORAM is incompatible with large volume silicon-based fabrication and device reliability is usually poor.

From the above, a new semiconductor device structure and integration is desirable.

BRIEF SUMMARY OF THE PRESENT INVENTION

The present invention is generally related to resistive switching devices. More particularly, embodiments according to the present invention provide a method and a structure for forming a resistive switching device. The present invention can be applied to non-volatile memory devices but it should be recognized that the present invention can have a much broader range of applicability.

In a specific embodiment, a method for forming a non-volatile memory device is provided. The method includes providing a semiconductor substrate having a surface region and forming a first dielectric material overlying the surface region. A first wiring material is formed overlying the first dielectric material. A contact material is formed overlying the first wiring material. The method includes forming a switching material overlying the contact material. In a specific embodiment, the switching material can include an amorphous silicon material. The methods subjects the first wiring material, the contact material, and the switching material to a first pattern and etch process to form a plurality of first structures. Each of the plurality of first structures includes at least a first wiring structure being spatially extending in a first direction and a switching element having a surface region. A second dielectric material is deposited overlying at least the plurality of first structures to form a thickness of second dielectric material overlying the switching material of each of the first structures. The second dielectric material includes a surface region. In a specific embodiment, the method includes forming an opening region in a portion of the thickness of second dielectric material to expose a portion of the surface region of the switching material. In a specific embodiment, the method selectively deposits a silver material in a portion of the opening region to partially fill the opening region while the surface region of the second dielectric material is free of the silver material. A second wiring material is deposited overlying the surface region of the second dielectric material including the silver material. In a specific embodiment, the method subjects the second wiring material to a second pattern and etch process to form a second wiring structure and preferably maintaining the silver material in the first portion of the opening region. In certain embodiment, the second wiring structure extends in a second direction and spatially configured at an angle to the first direction.

Many benefits can be achieved by ways of the present invention. For example, the present invention provides a method for depositing silver material to form a resistive switching device. The silver material is selectively deposited in an opening region such that silver contamination from a metal etch process is prevented. Indeed, etch of the silver is avoided by the selective nature of the deposition. Additionally, as the silver material is formed in an opening region allowing for ease of device scaling. Depending on the embodiments one or more of these benefits may be achieved.

DETAILED DESCRIPTION OF THE PRESENT INVENTION

The present invention is generally related to resistive switching devices. More particularly, embodiments according to the present invention provide a method and a structure for forming a resistive switching device. The present invention can be applied to non-volatile memory devices but it should be recognized that the present invention can have a much broader range of applicability In resistive switching using amorphous intrinsic silicon as the switching material, a metal material is usually used as at last one of the electrodes. The metal material forms a metal region in the amorphous intrinsic silicon material in the "on" state. In the "off" state, there is an absence or reduction of metal in the amorphous silicon. The resistance of the amorphous intrinsic silicon material is caused to change depending on a voltage applied to the electrodes. Silver is a material of choice as it has a suitable diffusion characteristic in the amorphous intrinsic silicon material. However, as silver material is not yet commonly used in CMOS fabrication, silver contamination from a metal etch process can be detrimental to the device as well as the fabrication equipments. This occurs when the silver in contact with the amorphous intrinsic Si is etched. When etching of the silver is complete, the etch profile may result in some or all of the amorphous intrinsic Si being etched as well. Etch residue containing silver may adhere to a newly etched sidewall of the amorphous intrinsic Si layer, resulting in undesirable enhanced conductivity of the amorphous intrinsic silicon, especially in the off state. FIGS. 1-10 are simplified diagrams illustrating a method of fabricating a resistive switching device for a non-volatile memory device according to an embodiment of the present invention. As shown a semiconductor substrate 100 having a surface region 102 is provided. The semiconductor substrate can be a single silicon wafer, a silicon germanium substrate or a silicon on insulator (commonly known as SOI) substrate depending on the application. In certain embodiments, semiconductor substrate 100 can include one or more CMOS device formed thereon. The one or more CMOS device provides for controlling circuitry for the resistive switching device in a specific embodiment. In other embodiments, the one or more MOS devices may include other functionality, such as a processor, logic, or the like.

Figure 1:
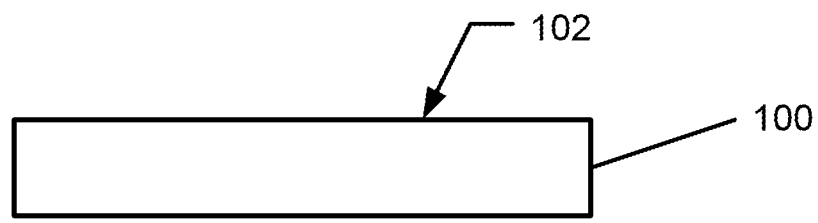
FIG. 1-10 are simplified diagram illustrating a method of forming a resistive switching device according to an embodiment of the present invention.
Figure 2:
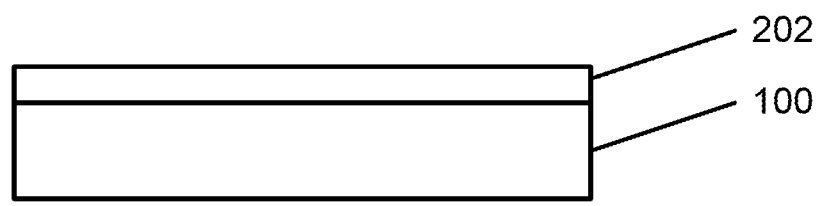

As shown in FIG. 2, the method includes forming a first dielectric material 202 overlying the surface region of the semiconductor substrate. First dielectric material 202 can be silicon oxide, silicon nitride, silicon oxynitride, or a dielectric stack including an alternating layers of silicon oxide and silicon nitride (for example, ONO) stack depending on the embodiment. First dielectric material 202 can be deposited using techniques such as chemical vapor deposition (CVD), for example, low temperature CVD, plasma enhanced CVD, high density plasma CVD (HDP CVD) and others. Other deposition techniques such as spin-on-glass may also be used depending on the application.

Figure 3:
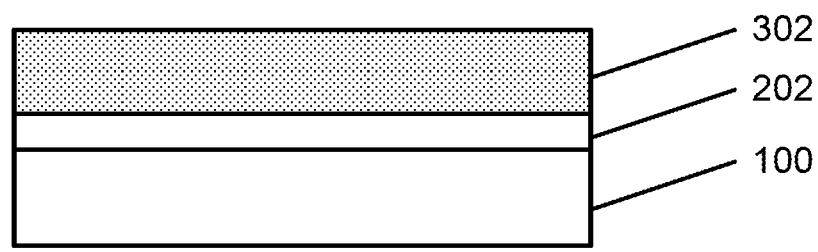

In a specific embodiment, the method includes forming a first wiring material 302 overlying the first dielectric material as shown in FIG. 3. First wiring material 302 can be tungsten, copper, or aluminum depending on the application. First wiring material is preferably deposited on an adhesion layer or a diffusion barrier layer such as titanium, titanium nitride, tantalum nitride or tungsten nitride, and the likes to prevent the first wiring material to migrate to other parts of the device and to promote adhesion between first wiring material 302 and first dielectric material 202. The first wiring material may be deposited by techniques such as physical vapor deposition, chemical vapor deposition, electroplating, or electroless deposition, or a combination of these, depending on the embodiment.

Figure 4:
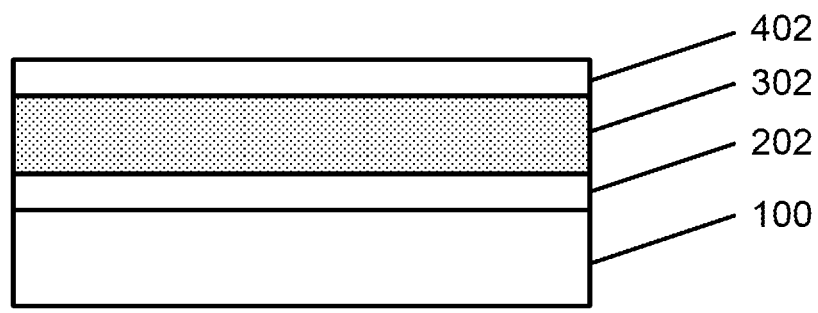

In certain embodiments, the method deposits a contact material 402 overlying first wiring material 302 as shown in FIG. 4. Contact material 402 comprises a polysilicon material in a specific embodiment. The polysilicon material is preferably having a p+ impurity characteristic in a specific embodiment. Depending on the embodiment, the p+ impurity can be provided using a boron species, a gallium species, an indium species, or an aluminum species at a concentration of about 1E18 per cm$^3$ to about 1E21 per cm$^3$. The polysilicon material can be deposited by a chemical vapor deposition process using silicon precursors such as silane, disilane or a suitable chlorosilane. Deposition temperature can range from about 350 Degree Celsius to about 800 Degree Celsius depending on the embodiment. The polysilicon material can be part of the first wiring material and prevents excessive defects to form on the first wiring material in a specific embodiment. Further, a barrier material such as titanium, titanium nitride, tantalum nitride or tungsten nitride can be used to prevent any unwanted reaction between contact material 402 and first wiring material 302 in a specific embodiment.

Figure 5:
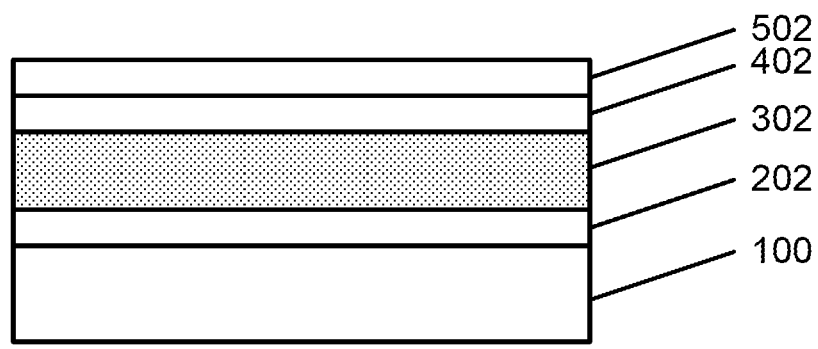

Referring to FIG. 5, the present method forms a resistive switching material 502 overlying the contact material. Resistive switching material 502 can include an amorphous silicon material in a specific embodiment. In a specific embodiment, the amorphous silicon is not intentionally doped and has an intrinsic semiconductor characteristic. Other non-crystalline silicon material having desirable properties may also be used. The amorphous silicon material may be deposited using chemical vapor deposition process using silane, disilane or a suitable chlorosilane as precursor. The amorphous silicon material may also be deposited using a physical vapor deposition process from a suitable silicon target material, depending on the application. Deposition temperature can range from about 150 Degree Celsius to about 500 Degree Celsius depending on the embodiment.

Figure 6:
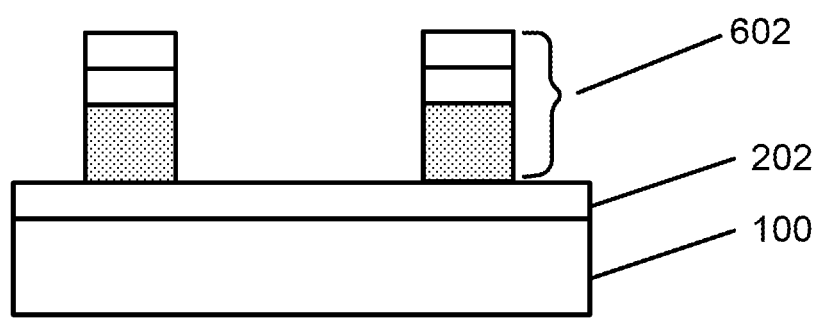

In a specific embodiment, the method subjects resistive switching material 502, contact layer 402, and first wiring material 302 to a first pattern and etch process to form a plurality of first structures 602 as shown in FIG. 6. In various embodiments, the plurality of first structures 602 are parallel, and extend in a first direction along the plane of the substrate 100. In certain embodiments, the first pattern and etch process can use a photoresist material as a mask for the etch process. Or the masking material may include a photoresist and a hard mask. The hard mask can be a dielectric or a metal hard mask depending on the embodiment. As shown, each of the first structure 602 includes an exposed surface region of the resistive switching material.

Figure 7:
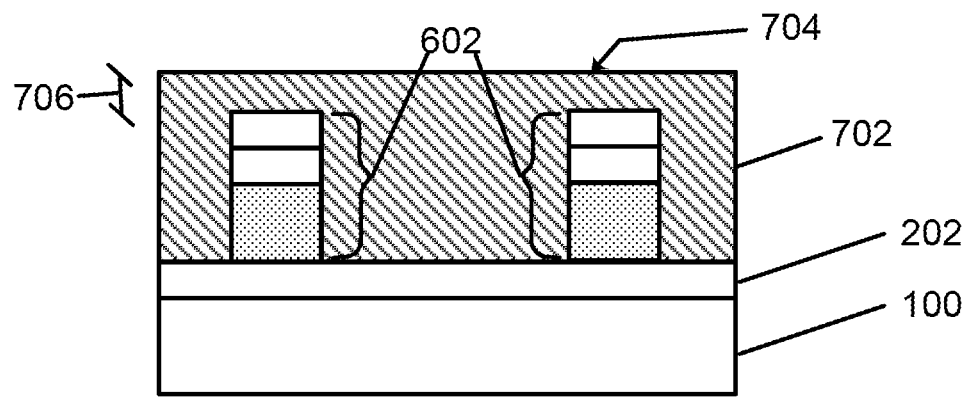

In various embodiments, the method forms a second dielectric material 702 overlying the plurality of first structures and fills the space between neighboring first structures. In a specific embodiment, second dielectric material 702 is subjected to a planarizing process to form a planarized surface region 704 as shown in FIG. 7. As shown, second dielectric material 702 forms a thickness 706 overlying each of the first structure 602 in a specific embodiment. Second dielectric material 702 can be silicon oxide, silicon nitride, dielectric stack such as ONO, high K dielectric, low K dielectric, and others, depending on the application.

Figure 8:
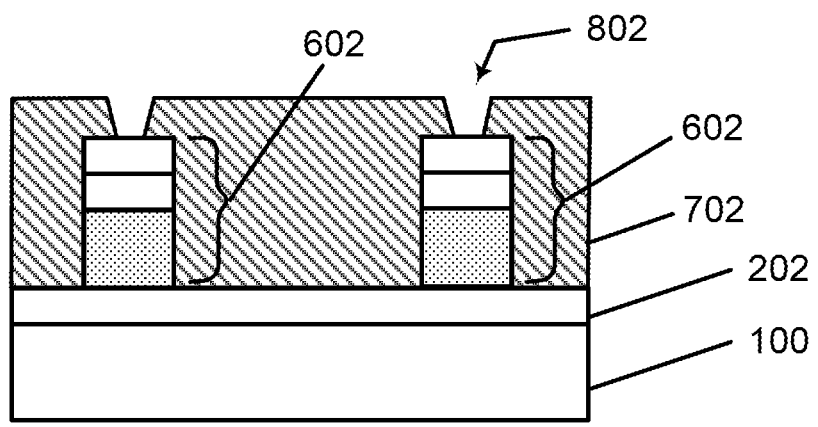

Referring to FIG. 8, the method subjects second dielectric material 702, which has been planarized to a second pattern and etch process to form an opening region 802 or a via structure in thickness 706 of second dielectric material overlying each of the first structure 602. Opening region 802 includes an exposed surface region of the resistive switching material 502 in a specific embodiment.

Figure 9:
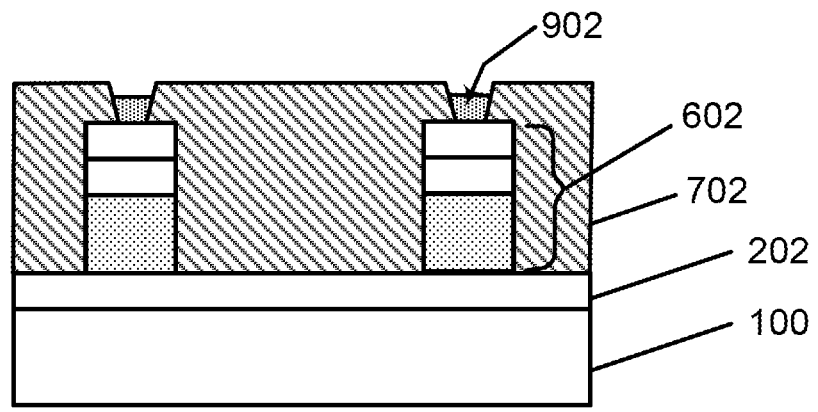

As shown in FIG. 9, the method includes selectively depositing a metal material 902 to at least partially fill opening region 802 in a specific embodiment. The metal material is silver in a specific embodiment. Silver can be deposited using an electroless deposition process, which selectively deposits the silver material on the amorphous silicon material in a specific embodiment. In light of the present disclosure, one of ordinary skill in the art will appreciate than many conventional electroless processes may be used, and they are within the scope of the present invention. In this selective deposition, silver deposits only on the exposed amorphous silicon material, and not on second dielectric material 702 surface. As shown, the silver material is in direct physical and electrical contact with the amorphous silicon material while the planarized surface region of second dielectric material 702 is free of the silver material in a specific embodiment.

Figure 10:
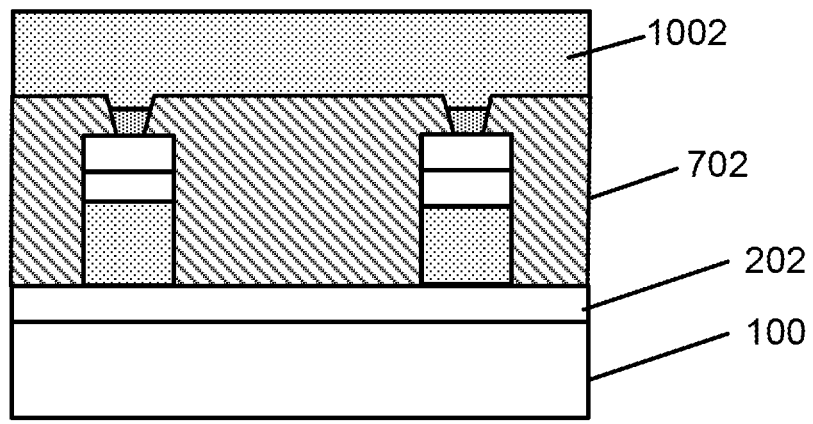

The method includes depositing a second wiring material 1002 overlying the planarized surface region of the second dielectric material and the silver material as shown in FIG. 10.

Depending on the embodiment, an adhesion layer and/or a diffusion barrier layer can be first formed overlying the second dielectric material before deposition of the second wiring material.

The method then subjects the second wiring material, including the adhesion layer and/or the diffusion barrier, to a third pattern and etch process to form a second wiring structure. As the silver material is formed only in a portion of the via which is subsequently filled with the metal material from the second wiring layer, the third pattern and etch process only removes portions of the second wiring material to form the second wiring structure, and does not remove any of the silver material in a specific embodiment. This prevents silver contamination on the exposed sidewall of the intrinsic amorphous silicon switching material. It also minimizes or eliminates silver contamination in etching equipment. In a specific embodiment, the second wiring structure is spatially configured to extend in a second direction orthogonal to the first direction of the first wiring structure to enable a high density interconnected crossbar array. Such array of resistive switching devices can be used for a non-volatile memory device in a specific embodiment.

Figure 11:
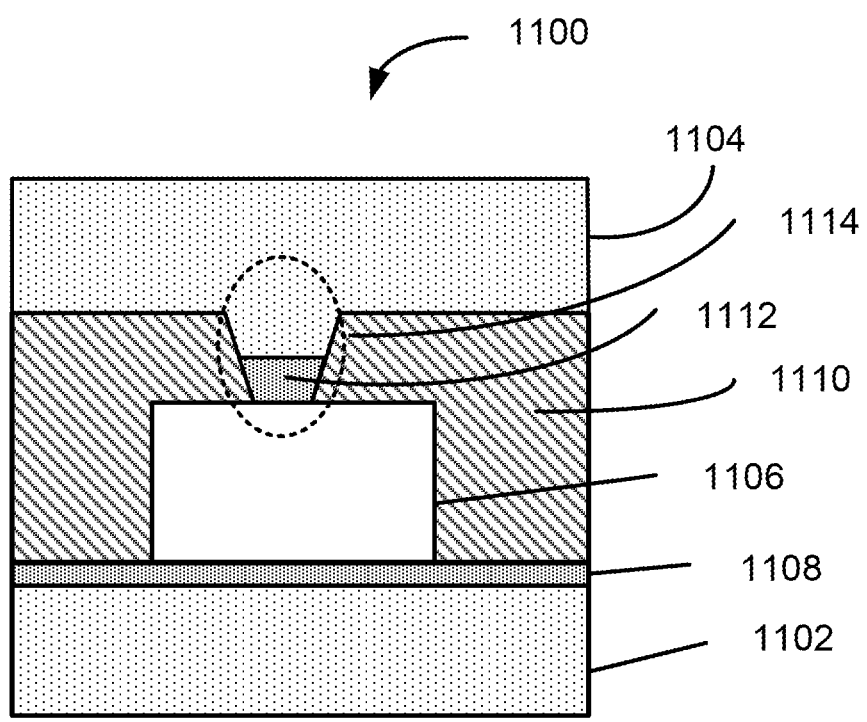
FIGS. 11-13 are simplified diagram illustrating a resistive switching device construction and operations according to various embodiment of the present invention.

As illustrated in FIG. 11, a resistive switching device 1100 for a non-volatile memory device is provided. Resistive switching device 1100 includes a first wiring structure 1102 spatially configured to extend in a first direction and a second wiring structure 1104 spatially configured to extend in a second direction orthogonal to the first direction. In a specific embodiment, resistive switching device 1100 includes a resistive switching region 1106 overlying the first wiring structure and disposed in an intersection region formed from the first wiring structure and the second wiring structure. In a specific embodiment, resistive switching region 1106 can include an amorphous silicon material having an intrinsic semiconductor characteristic. A junction material 1108 comprising a p+ polysilicon material is disposed between the resistive switching material 1106 and the wiring structure 1102.

In a specific embodiment, resistive switching device 1100 includes a dielectric material 1110 overlying the switching region. The dielectric material includes a surface region and an opening region 1114 overlying the switching region in a specific embodiment. In a specific embodiment, a silver material 1112 is configured in a portion of the opening region and in contact with the amorphous silicon material while the surface region of the dielectric material is free of any or includes less the silver material. The device includes a second wiring structure overlying the dielectric material and the silver material. The second wiring structure is spatially configured to extend in a second direction orthogonal to the first direction in a specific embodiment.

Figure 12:
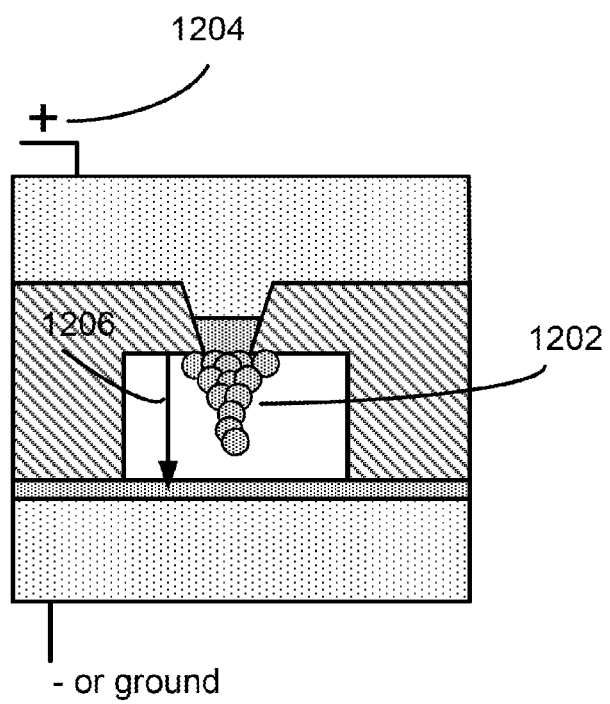

As illustrated in FIG. 12, in embodiments of methods of operating the structure described above, the silver material forms a silver region 1202 derived from the silver material in a portion of the amorphous silicon material upon application of a forward bias voltage. The forward bias voltage is a positive voltage 1204 with respect to the second wiring structure. The silver region comprises a plurality of silver particles formed in the amorphous silicon in a specific embodiment. The plurality of silver particles can include silver ions, silver clusters, silver atoms, and others. The silver region reduces the resistance of the amorphous silicon material. In a specific embodiment, the silver region further includes a filament structure characterized by a length and a distance between the silver particles. The filament structure is configured to extend 1206 towards the first electrode structure upon application of a programming voltage and the device is in a low resistance state or a programmed state. The programming voltage can range from about 4 volts to about 8 volts, or larger or smaller depending on a device size and processing conditions of amorphous silicon material.

Figure 13:
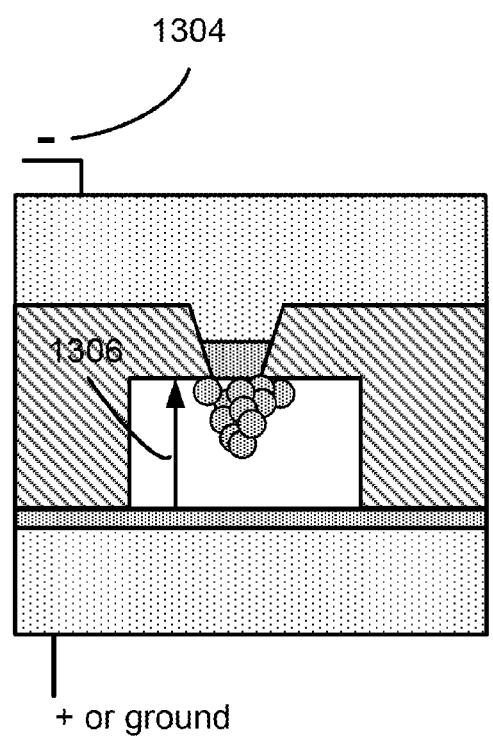

As shown in FIG. 13, the filament structure retracts 1306 upon application of a backward bias voltage 1304 after programming. The backward bias voltage comprises of a negative voltage applied to the second electrode with respect to the first electrode in a specific embodiment. The backward bias voltage can have a magnitude substantially the same as the forward bias voltage and can be slightly lower (for example about 5-10 percent lower) than the forward bias voltage, in some embodiments. Accordingly, depending on a voltage applied to the device the resistance of the amorphous switching material can be modulated. This enables a multi bit storage capability by configuring a cell at various resistance values. Multi bit storage capability is made possible by two or more discrete resistance values or states for each of the device.

In various embodiments, as the memory devices describe herein are small compared to standard memories, a processor, or the like, may include greater amounts of memory (cache) on the same semiconductor device. As such memories are relatively non-volatile, the states of such processors, or the like may be maintained while power is not supplied to the processors. To a user, such capability would greatly enhance the power-on power-off performance of devices including such processors. Additionally, such capability would greatly reduce the power consumption of devices including such processors. In particular, because such memories are non-volatile the processor need not draw power to refresh the memory states, as is common with CMOS type memories. Accordingly, embodiments of the present invention are directed towards processors or other logic incorporating memory devices, as described herein, devices (e.g. smart phones, network devices) incorporating processors or other logic incorporating such memory devices, and the like. In addition to the memory devices described herein, additional embodiments may include display components, communication components and circuitry, button, cases, housings, enclosures, batteries, and the like.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method of forming a non-volatile memory device, comprising:
  providing a semiconductor substrate having a surface region;
  forming a first dielectric material overlying the surface region;
  forming a first wiring material overlying the first dielectric material;
  forming a switching material comprising an amorphous intrinsic silicon material overlying the first wiring material;
  subjecting the first wiring material and the switching material to a first pattern and etch process to form a plurality of first structures, each of the plurality of first structures comprising at least a first wiring structure being spatially extending in a first direction and a switching material having a surface region; depositing a second dielectric material overlying at least the plurality of first structures to form a thickness of second dielectric material overlying the switching material of each of the plurality of first structures, the second dielectric material comprising a surface region;

forming an opening region in a portion of the thickness of second dielectric material, exposing a portion of the surface region of the switching material; and selectively forming a silver material in a portion of the opening region to at least partially fill the opening region while the surface region of the second dielectric material being free of attachment of the silver material.

2. The method of claim 1 further comprises depositing a second wiring material overlying the surface region of the second dielectric material including the silver material and;

subjecting the second wiring material to a second pattern and etch process to form a second wiring structure while maintaining the silver material in the first portion of the opening region in contact with the switching material and maintaining the surface region of the second dielectric material free of attachment of the silver material, the second wiring structure being extended in a second direction and spatially configured at an angle to the first direction.

3. The method of claim 1 further comprises forming a contact material overlying the first wiring material, the contact material comprises a polysilicon material having a p+ impurity characteristic.

4. The method of claim 3 wherein the p+ impurity characteristic is provided by a boron species, an aluminum species, a gallium species, or a indium species, each having a concentration ranging from about 1E18 to about 1E22 per $cm^3$.

5. The method of claim 1 wherein the semiconductor substrate comprises one or more CMOS device operably coupled to the non-volatile memory device.

6. The method of claim 1 wherein the first dielectric material is selected from a group consisting of: silicon oxide, silicon nitride, a high K dielectric, and a dielectric stack comprising an alternating layers of silicon oxide and silicon nitride.

7. The method of claim 1 wherein the first wiring structure further comprises one or more diffusion barrier layers or adhesion layer.

8. The method of claim 1 wherein the selectively forming the silver material comprises a process selected from a group consisting of: an electroless deposition process, an electroplating process, and a chemical vapor deposition process.

9. The method of claim 1 wherein the second pattern and etch process maintains the silver material in the portion of the opening region and does not remove any of the silver material.

10. The method of claim 1 wherein the first wiring material and the second wiring material each comprises tungsten, copper, or aluminum.

11. The method of claim 1 wherein the first wiring material and the second wiring material further comprise an adhesion layer or a diffusion barrier layer.

12. The method of claim 9 wherein the adhesion layer or the diffusion layer comprises titanium, titanium nitride, tantalum nitride or tungsten nitride.

13. The method of claim 1 further comprises forming a contact material overlying the first wiring material, the contact material comprises a polycrystalline silicon-containing material having a p+ impurity characteristic.

14. The method of claim 1 wherein the switching material is configured to include silver particles from the silver material in a filament structure.

15. The method of claim 1 wherein the silver material in the portion of the opening region partially fills the opening region.

16. The method of claim 1 wherein the forming the switching material comprises forming the amorphous intrinsic silicon without intentional dopants.

17. The method of claim 2 wherein the depositing the second wiring material overlying the surface region comprises depositing the second wiring material to partially fill the opening region.

18. The method of claim 2 wherein the angle is approximately 90 degrees.

19. The method of claim 5 wherein the one or more CMOS devices is selected from a group consisting of: control circuitry, a processing device, and a logic device.

* * * * *